United States Patent

Kahng et al.

[15] 3,651,349

[45] Mar. 21, 1972

[54] MONOLITHIC SEMICONDUCTOR APPARATUS ADAPTED FOR SEQUENTIAL CHARGE TRANSFER

[72] Inventors: Dawon Kahng, Bridgewater Township, Somerset County; Edward Haig Nicollian, Murray Hill, both of N.J.

[73] Assignee: Bell Telephone Laboratories, Incorporated, Murray Hill, N.J.

[22] Filed: Feb. 16, 1970

[21] Appl. No.: 11,448

[52] U.S. Cl. ........................307/304, 317/235 R, 307/221 C

[51] Int. Cl. ........................................................H01l 11/14

[58] Field of Search...............317/235; 307/305, 221 C, 238, 307/251, 279, 304

[56] References Cited

UNITED STATES PATENTS 3,333,168 7/1967 Hofstein ................................317/235

3,473,032 10/1969 Lehovec ...............................317/235

*Primary Examiner*—Jerry D. Craig

*Attorney*—R. J. Guenther and Arthur J. Torsiglieri

[57] ABSTRACT

In monolithic semiconductor devices of the type wherein storage and manipulation of electronic signals representing information are accomplished by the storage and sequential transfer of packets of excess minority carriers localized in artificially induced potential wells, predictable directionality of charge-packet transfer requires that the potential well be asymmetrical, at least during the transfer operation. The instant invention includes the use of overlapping gate electrodes and/or nonuniform dielectric thicknesses under the gate electrodes of MIS structures so that an appropriately asymmetrical potential well always is formed whenever a voltage is applied to any gate electrode.

16 Claims, 7 Drawing Figures

INVENTORS D. KAHNG
E. H. NICOLLIAN

BY Arthur J. Torsiglieri
ATTORNEY

MONOLITHIC SEMICONDUCTOR APPARATUS ADAPTED FOR SEQUENTIAL CHARGE TRANSFER

BACKGROUND OF THE INVENTION

This invention relates to information storage devices; and, more particularly, to monolithic semiconductor apparatus adapted for storing and sequentially transferring electronic signals which represent information.

In United States application Ser. No. 11,541, filed of even date herewith, and assigned to the assignee hereof, there is disclosed a new class of monolithic semiconductor apparatus adapted for storing and sequentially transferring electronic signals representing information in the form of packets of excess minority carriers localized in artificially induced potential wells, e.g., such as can be associated with a metal-insulator-semiconductor (MIS) structure. Essentially, in the MIS embodiments, a plurality of metal electrodes are disposed in a row over the insulator (dielectric), which in turn overlies and is contiguous with the surface of a semiconductor body. Sequential application of voltages to the metal (gate) electrodes induces potential wells adjacent the surface of the semiconductor body in which packets of excess minority carriers can be stored and between which these packets can be transferred. To ensure predictable directionality of charge-packet transfer, the transferor potential well must be asymmetrical, at least during the transfer operation. As disclosed in the aforementioned Boyle-Smith disclosure, at least three-phase clock pulses are required to provide the requisite asymmetry. This is a problem for some applications in that separate conduction paths must be used for each separate phase. It is usually desirable to minimize the number of conduction paths (and attendant conduction path crossovers) in monolithic semiconductor apparatus.

SUMMARY OF THE INVENTION

To these and other ends, we have invented a new and improved form of that class of apparatus in which only two-phase clock pulses are required and which, when formed in two-dimensional arrays, requires only one information conduction path (for clock pulses) per row.

This two-phase clock capability is achieved, in part, through the use of MIS structures having overlapping gate electrodes and/or nonuniform oxide thicknesses so that an appropriately asymmetrical potential well is induced whenever a clock pulse is applied to any gate electrode.

More specifically, Specifically, in accordance with one embodiment of our invention, each gate electrode is disposed over a portion of a dielectric layer, the portion having at least two, and for some applications preferably three, distinct thicknesses under the gate electrode. Inasmuch as the strength of the potential at any point on the semiconductor surface is inversely proportional to the thickness of the oxide between the gate electrode and that surface point, it will be appreciated that an asymmetrical potential well will necessarily be induced under the gate electrode whenever a potential is applied thereto. From the detailed description hereinbelow, it will readily be understood that this asymmetry can be induced in a form such as to enhance the transfer of excess minority carriers in a predetermined direction and to impede the transfer of those carriers in the opposite direction.

In accordance with another, and preferred, form of our invention, both nonuniform dielectric thicknesses and overlapping gate electrodes are used to provide the requisite asymmetry and to facilitate the coupling of adjacent potential wells for further enhancing the ease of transferring charge from one potential well to the one next adjacent.

In another aspect, an important feature of our invention is the implementation of a two-dimensional array of such devices in a matrix comprising rows and columns in such a manner that only one clock pulse-conduction path is required per row of devices. More specifically, although a two-phase clock is required, we have arranged our matrix such that each clock pulse conduction path is disposed parallel to and between pairs of adjacent rows of electrodes. Each clock pulse conduction path is connected to corresponding electrodes in both of the rows between which it is disposed. This feature and its importance will be discussed in more detail hereinbelow where, for example, various uses including use in a vidicon scanning arrangement will be described.

BRIEF DESCRIPTION OF THE DRAWING

The invention will be better understood from the following more detailed description taken in conjunction with the accompanying drawing in which.

It will be appreciated by those in the art that the figures have not been drawn to scale, but that certain portions have been exaggerated in relative size for clarity of explanation.

DETAILED DESCRIPTION

Figure 1:
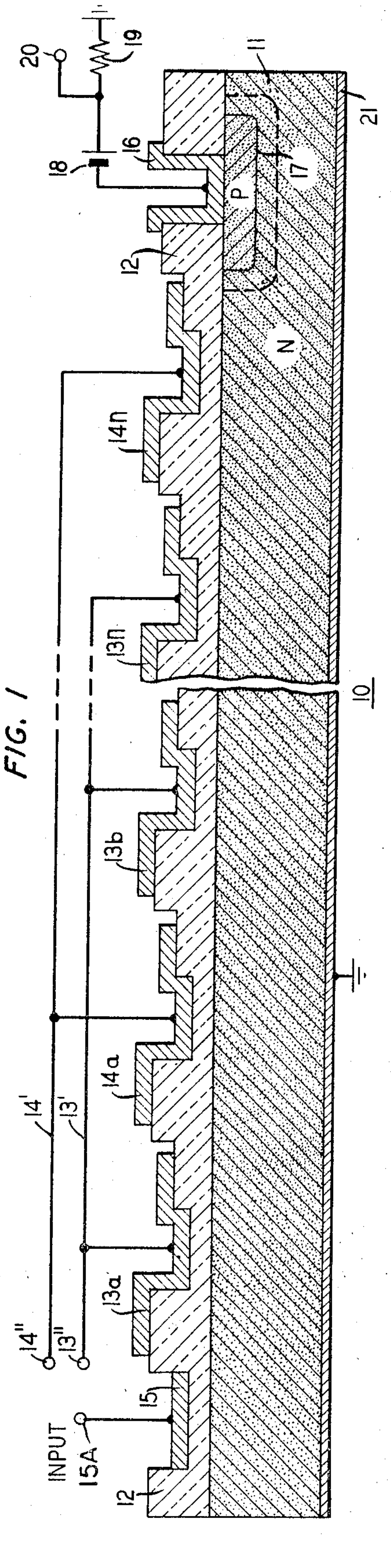
FIG. 1 shows a cross-sectional view of monolithic semiconductor apparatus in accordance with one embodiment of our invention in which adjacent gate electrodes are spaced from each other but are disposed over dielectric portions of nonuniform thickness.

With more specific reference now to the drawing, in FIG. 1 there is shown a basic form of one embodiment of our invention in which adjacent electrodes are spaced from each other and are disposed over dielectric portions of nonuniform thickness. As shown, the monolithic apparatus 10 includes a semiconductive bulk portion 11 of a first type conductivity (shown here illustratively as N-type). Overlying the surface of bulk portion 11 is a dielectric layer 12 of nonuniform thickness. A plurality of electrodes 13*a*, 14*a*, 13*b*, ... 13*n*, *–n* are shown overlying dielectric layer 12, each of those electrodes overlying and being contiguous with the surface of a dielectric portion having three distinct thicknesses. Electrodes 13 (including 13*a* through 13*n*) are connected to a first conduction path 13'; and electrodes 14 (including 14*a* through 14*n*) are connected to a second conduction path 14', both of the conduction paths being adapted for coupling clock pulses applied to terminals 13'' and 14'' to the electrodes to which they are connected.

Electrode 15, to which input terminal 15A is connected, overlies a relatively thin portion of the dielectric layer and is adapted for causing the introduction of excess minority carriers, e.g., by field-induced avalanche injection, into the semiconductive portion thereunder. In this manner, input pulses can be coupled into a potential well induced under electrode 13*a*, as will be described in more detail with reference to FIG. 2.

Figure 2:
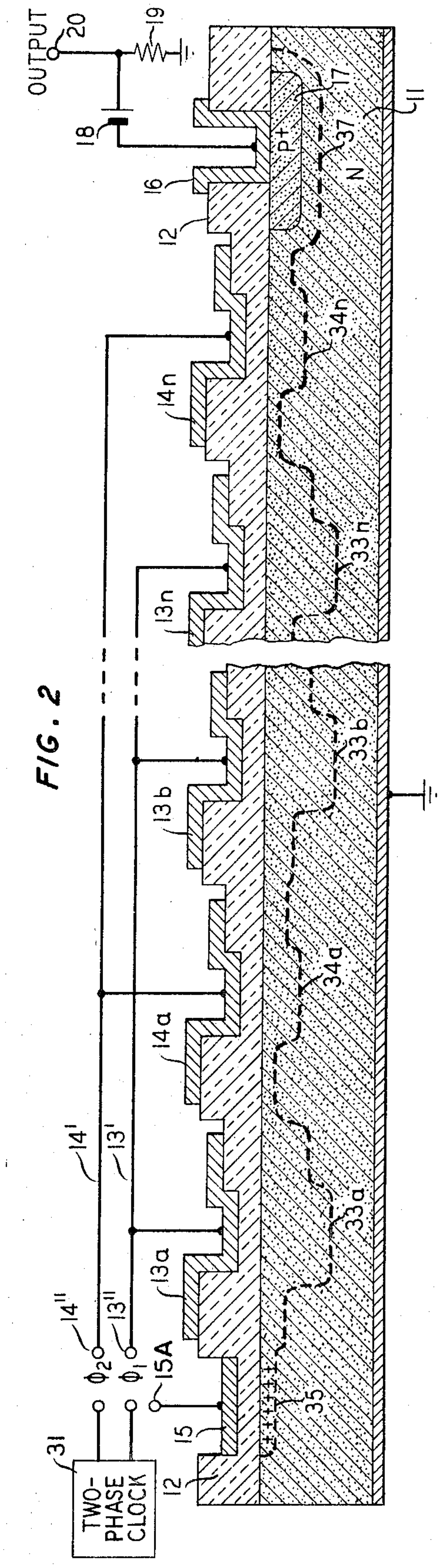
FIG. 2 shows the apparatus of FIG. 1 and the approximate shape and position therein of potential wells with a clock pulse applied.

A localized P-type zone 17 in combination with electrode 16 which makes low resistance electrical contact thereto, batter 18, and resistor 19, are simply a schematic representation of one means for detecting any excess minority carriers which may be in a potential well under electrode 14*n*, as will also be described in more detail in reference to FIG. 2.

A metallic electrode 21, formed on the back surface of bulk portion 11, is shown connected to electrical ground. This is the presently preferred mode of operation. However, it should be appreciated that bulk portion 11 could as well be connected to any fixed reference potential provided the clock pulse voltages were correspondingly adjusted. The apparatus can also be operated with bulk portion 11 "floating."

Figure 3:
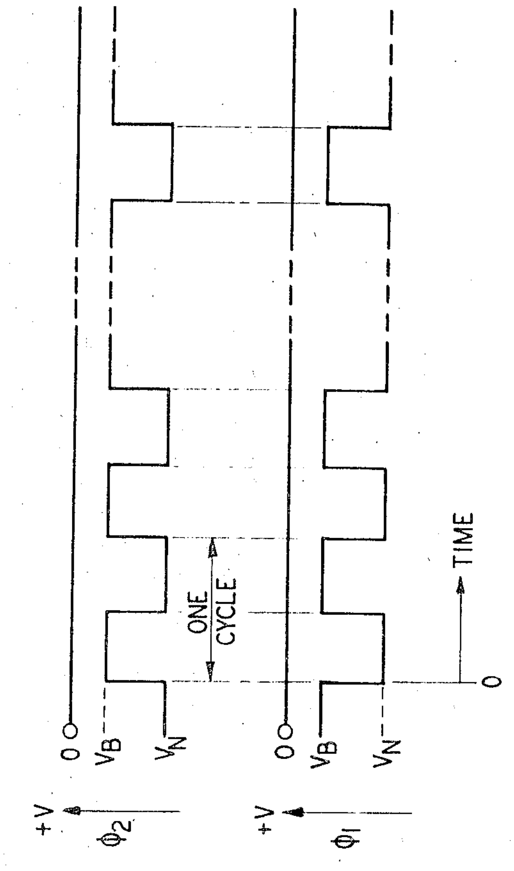
FIG. 3 shows schematically appropriate two-phase voltage waveforms for use in accordance with our invention.

With reference now to FIG. 2, there is shown the apparatus of FIG. 1 with two-phase clock means 31 applied. FIG. 3 shows schematically appropriate voltage waveforms produced by clock means 31.

As described in more detail in the Boyle-Smith disclosure mentioned hereinabove, if silicon and silicon dioxide are used as the semiconductive portion and the dielectric, respectively, a preferred method of operation makes use of a continuous uniform prebias on all gate electrodes 13*a*–13*n* and 14*a* –14*n* to maintain at least a shallow depletion layer over the entire surface of the device at all times so as to minimize the effect of surface states which are inevitably present at the silicon-silicon oxide interface. These surface states can be troublesome inasmuch as they contribute to surface recombination of some fraction of the excess minority carriers which in turn leads necessarily to signal degradation. Maintenance of a suitable prebias on all gate electrodes will tend to minimize the adverse effects of such surface states. Accordingly, as shown in FIG. 3, the clock outputs are always some amount negative ($V_B$), to provide this prebias. Of course, in embodiment in which surface states are not a problem, this prebias need not be used, in which case the clock voltage could alternate, for example, between zero volts and some negative voltages.

Also shown in FIG. 2 are schematic representation of the boundaries (33*a*–33*n* and 34*a* –34*n*) of the depletion regions formed in semiconductive bulk portion 11 at some time just past $t$=0, i.e., when $\phi_1$ is most negative ($V_N$) and $\phi_2$ is least negative ($V_B$). Inasmuch as a more negative potential is applied to electrodes 13 than is applied to electrodes 14, depletion regions 33 (under electrodes 13) extend significantly further into bulk portion 11 than do depletion regions 34 (under electrodes 14). Further, it should be noted that all depletion regions under electrodes 13 and 14 are asymmetrical, i.e., least extensive under that portion of their corresponding electrode where the dielectric is thickest, most extensive under that portion of their corresponding electrode where the dielectric is thinnest, and of intermediate extent under that portion of their corresponding electrode under which the dielectric is of thickness intermediate to the thickest and thinnest.

At this point it may be well to explain the relation between the distance a depletion region extends into the semiconductor and the field potential at the semiconductor-dielectric interface. In simplest terms, the more negative the field potential at the interface, the greater will be the extent of the depletion region into the semiconductor. Accordingly, the depletion region boundaries 33 and 34 may also be thought of representative of the electric field profile which then exists at the semiconductor-dielectric interface.

Assume, now, that with the potentials as just described, an input pulse is applied to input terminal 15A sufficient to inject a number of minority carriers (holes), indicated as "+" into the semiconductor under electrode 15. Because depletion layer 35, under electrode 15, overlaps depletion layer 33*a*, under gate electrode 13*a*, these excess holes will be drawn into the most negative potential (under the center portion of electrode 13*a*). Until the clock voltages switch polarity, these excess minority carriers will remain localized (in what is termed a "charge packet") under the center of electrode 13*a* since there is a local region of most negative potential, i.e., a potential well.

Then, in the next half of the clock cycle, when electrodes 14 are at the most negative potential ($V_N$) and electrodes 13 are at a less negative potential ($V_B$), those excess minority carriers will have moved to the right under the now local most negative point under the center portion of electrode 14*a*. In this half of the clock cycle, of course, the field profiles and depletion regions depths will be under electrodes 14 as they were under electrodes 13 during the previous first half of the clock cycle, and vice versa.

Considering the shifting process one more step, during the first half of the next clock cycle (when electrodes 13 are most negative and electrodes 14 are least negative) the charge packet will again move to the right and become localized at the local potential minimum under the center portion of electrode 13*b*.

Notice that the (positively charged) charge packets will never move to the left because the built-in asymmetry of the potential wells is such that the potential at the right of a local minimum is always more negative than the potential immediately to the left of that local minimum, i.e., the built-in asymmetry of the potential wells is such as to enhance charge transfer in the desired direction (in this case, to the right) and to impede charge transfer in the opposite direction (in this case, to the left).

Assume now that "$n$" clock cycles have gone by so that the charge packet has moved into the potential well under the last gate electrode 14*n*. This is the output end of the apparatus. Battery 18 supplies a sufficient voltage through electrodes 16 to keep the PN junction associated with localized zone 17 reverse-biased by an amount sufficient that its space charge depletion region partially overlaps the depletion region 34*n* under electrode 14*n*. Accordingly, the charge packet is swept to the right and is collected by the PN junction in much the same fashion as carriers are collected in the collector-base junction of an ordinary transistor. This charge carrier collection manifests itself in a current which flows through battery 18 and resistor 19, causing a corresponding voltage to be developed at terminal 20 which can then be detected as the output.

It will now be apparent that what has been described is a monolithic semiconductor apparatus capable of operating as a shift register. A shift register embodiment has been described because it is a desirable vehicle for simplicity and clarity of explanation and because shift registers are important building blocks from which many forms of logic, memory, and delay devices can be derived. For example, it will be appreciated that at any intermediate point, e.g., at electrode 14*f*, the shift register chain could be tapped into and fan-in or fanout could be achieved if desired for some logic application. Further, it will be appreciated that the shift register can be operated in a recirculation mode either for increasing the storage duration (delay) or for regenerating the signal to overcome noise, charge losses, or other forms of signal degradation by simply connecting the output signal back to the input stage through an appropriate regeneration circuit.

Referring again to FIGS. 1 and 2, it will be understood that a three-step dielectric thickness under each gate electrode need not be used, but that a two-step oxide thickness could be used. In this case, one would retain the two leftmost portions of each gate electrode, i.e., the thickest and the thinnest; and the rightmost third, i.e., of intermediate thickness would not be used. Two-phase clock operation would be the same as previously described with reference to the three-step dielectrics.

Selection of a two-step or a three-step oxide depends on detailed considerations which are as follows. In a semiconductor, charge carriers move by one or both of two processes, drift and diffusion. Drift is electric field-motivated, but diffusion moves randomly from points of greater charge density to points of lesser charge density. A moment's consideration of the potential wells shown in FIG. 2 and of how they would appear with a two-step oxide, should convince those in the art that under certain extreme conditions the diffusion component to the left could tend to overcome the drift component to the right. However, this would be much less likely to happen in the three-step case because the intermediate step (at the right of each potential well) will tend to cause a preferred "diffusion leak" to the right, i.e., in the desired direction of propagation.

Figure 4:
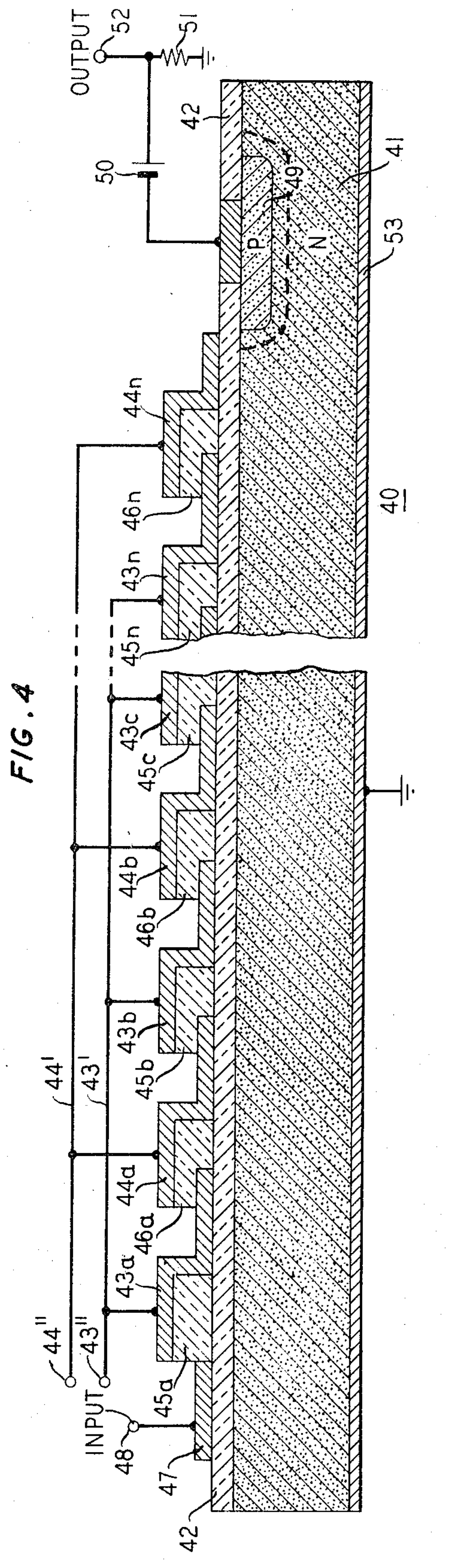
FIG. 4 shows a cross-sectional view of monolithic semiconductor apparatus in accordance with another embodiment of our invention in which adjacent gate electrodes, in addition to being formed over nonuniform thicknesses, partially overlap.

With reference not to FIG. 4 there is shown a cross sectional view of another monolithic embodiment of our invention in which adjacent gate electrodes, in addition to being formed on nonuniform dielectric thicknesses, partially overlap each other. This embodiment is considered advantageous for many applications because the overlapping of adJacent gate electrodes tends: (1) to reduce the practical problem of having to form closely spaced electrodes on one plane surface, and (2) to facilitate the coupling of adjacent potential wells which further enhances the ease of transferring charge packets from one potential well to the one next adjacent in the desired direction.

More specifically, the apparatus 40 shown in FIG. 4 includes a semiconductive bulk portion 41 of a first type conductivity (again, shown illustratively as N-type), overlying which there is a substantially uniform first dielectric layer 42. A plurality of gate electrodes 43a–43n and 44a–44n overlie layer 42, adjacent ones of the gate electrode overlapping each other, as shown. A plurality of additional dielectric portions 45a–45 and 46a–46n also overlie layer 42 and are disposed between the overlapping electrodes so that there is no direct electrical connection at the points of overlap. Input electrode 47, input terminal 48, and output features 49,50,51, and 52 are analogous to the corresponding features described with reference to FIGS. 1 and 2 hereinabove.

Clock pulses just like those shown in FIG. 3 and described with reference to FIGS. 1 and 2 can be used to shift charge packets in the apparatus shown in FIGS. 4, 5, and 6. Accordingly, the same two-phase clock means 31 shown in FIG. 2 is shown again in FIGS. 5 and 6.

Figure 5:
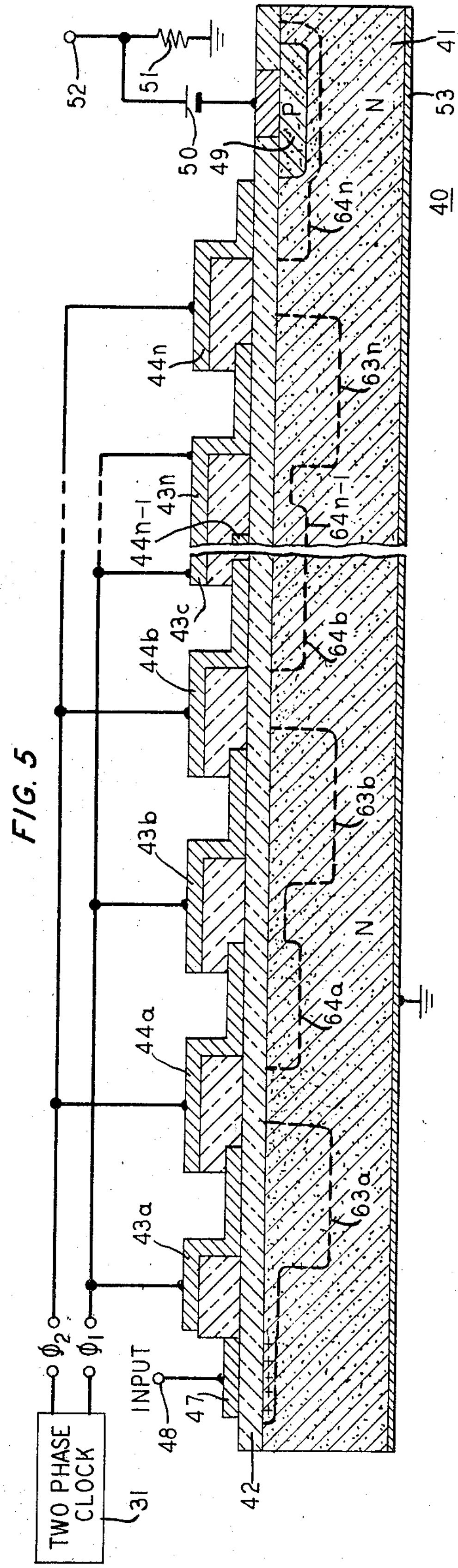
FIG. 5 shows the apparatus of FIG. 4 and the approximate shape and position therein of potential wells with a clock pulse applied.

Referring more specifically, then, to FIG. 5, there is shown the apparatus of FIG. 4 with two-phase clock means 31 applied. Broken line features 63a–63n and 64a–64n represent schematically the boundaries of the depletion regions formed in bulk portion 41 at some time just past $t$=0, i.e., when $\phi_1$ is most negative ($V_N$) and $\phi_2$ is least negative ($V_B$). Of course, the above discussion with respect to the relation between depletion region depth and electric field potential applies to the structure of FIGS. 4, 5, and 6 as well as it applied to the structure of FIGS. 1 and 2.

However, it should be noted in FIG. 5 that the dielectric thicknesses and the least negative clock voltage ($V_B$) have been adjusted in relation to each other such that $V_B$ is insufficient to create a depletion region under the portions of the gate electrodes overlying the thicker dielectric. More specifically, note the gap between depletion regions 63a and 64a, 63b and 64b, etc. This gap is preferred in order to completely eliminate the possibility of charge diffusion to the left, described with reference to FIGS. 1 and 2 hereinabove.

Notice also, in FIG. 5, that any positive charges introduced under input electrode 47 will be immediately swept into depletion region 63a and will be trapped there while $\phi_1$ is most negative ($V_N$).

Figure 6:
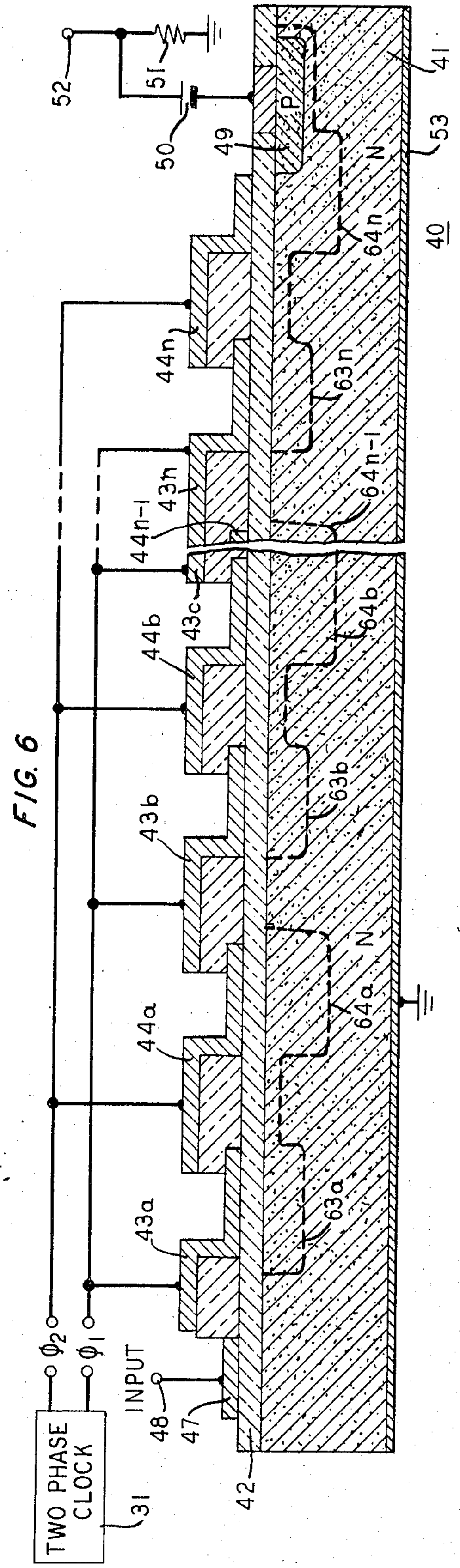
FIG. 6 shows the apparatus of FIGS. 4 and 5 at another point in time.

With reference now to FIG. 6 there is shown the approximate positions of depletion regions 63 and 64 while the clock pulses are reversing polarity, i.e., while $\phi_1$ is switching from $V_N$ to $V_B$ and $\phi_2$ is switching from $V_B$ to $V_N$. Notice that at the selected intermediate point in time, the previous gap between depletion regions 63a and 64a, 63b and 64, etc. has been bridged; and that similar gaps have formed between depletion regions 64a and 63b, 64b and 63c, 64n−1 and 63n, etc. A moment's consideration should convince the worker in the art that this alternate depletion region decoupling (gapping) and coupling is such as to enhance charge transfer to the right (toward the output) and to impede charge transfer to the left. Additionally, in view of the obvious asymmetry in the depletion regions shown in FIGS. 5 and 6 it will be apparent that with each reversal of the clock pulse polarity, there will be a strong tendency for any charge packets trapped in any given potential well to transfer to the right, as desired, toward the output.

Inasmuch as the detection of pulses at the output of the apparatus of FIGS. 4, 5, and 6 is directly analogous to the output detection described hereinabove with reference to FIGS. 1 and 2, no further discussion of FIGS. 4, 5, and 6 is deemed necessary.

Figure 7:
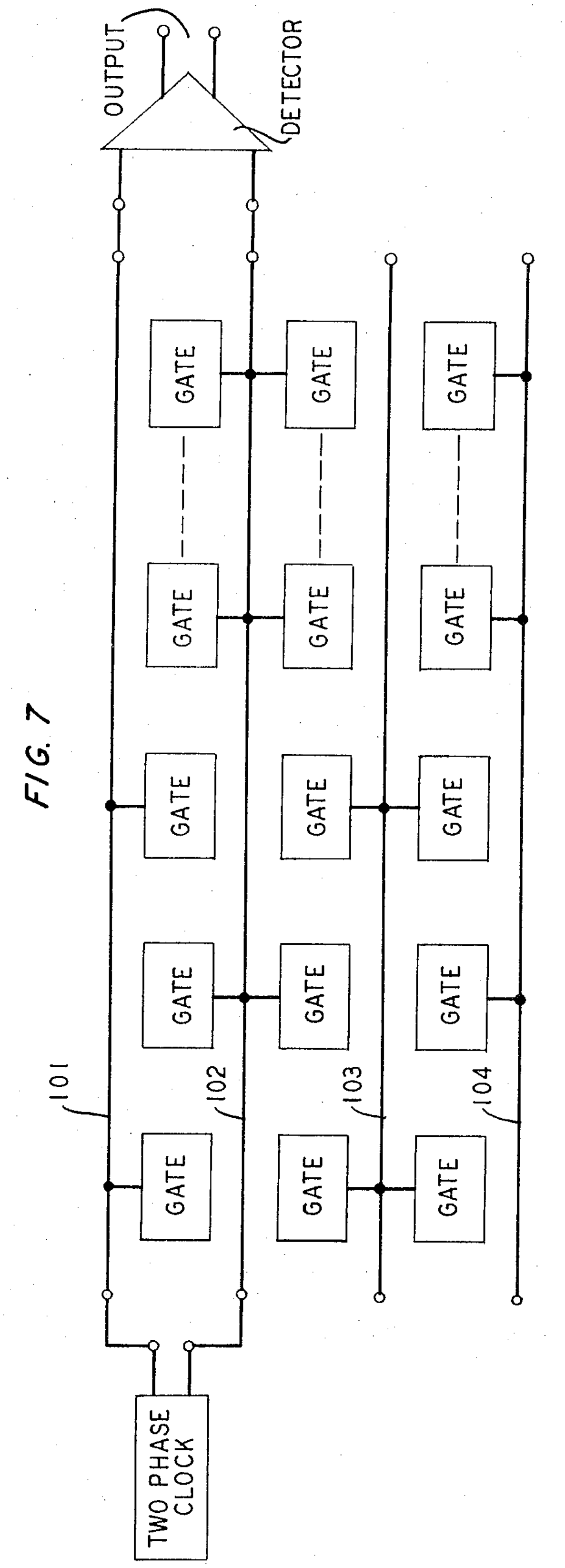
FIG. 7 shows a schematic block diagram of an advantageous two-dimensional arrangement of devices in accordance with our invention.

With reference now to FIG. 7 there is shown a schematic representation of a two-dimensional array of devices such as disclosed hereinabove. More specifically, each row of blocks labeled "GATE" may be exactly like any of the rows of devices shown in cross section in FIGS. 1, 2, 4, 5, and 6. Each block labeled "GATE" schematically represents one of the gate electrodes numbered 13, 14, 43, or 44 in those aforementioned figures. Application of the two-phase clock means, as shown, to conduction paths 101 and 102 will cause the contents of the top row to be shifted out and detected sequentially by the "DETECTOR" and translated in an appropriate output signal. This shifting of the contents of the top row will not affect the contents of signals stored in the other rows because at most only one, 102, of the clock pulse conduction paths connected to the gates in those rows is being pulsed.

After the contents of the top row have been completely shifted out to the right and detected, the clock and the detector would then be connected to conduction paths 102 and 103 and the contents of the second row would be shifted out in like manner. Of course, for optimum results, suitable switching and timing means should be included to switch the clock and the detector from one pair of conduction paths to another and for appropriately timing the output from the detector. A variety of such circuitry can be used, the design of which is well within the capability of those skilled in the art. Accordingly such circuitry will not be described in detail herein.

It will be apparent that a two-dimensional array such as indicated in FIG. 6 may find especially advantageous use as the photosensitive elements in a video camera, in much the same manner as described in the Boyle-Smith disclosure referred to hereinabove. Each row of devices may represent one raster line in the video system. Each raster line would be read-out electronically by serially transferring the photo-generated charge packets to a detector at the end of the row. A video frame would be constructed by sequentially reading each raster line.

Further it will also be apparent that a two-dimensional array such as indicated in FIG. 6 may also find especially advantageous use as a solid state image display device such as disclosed in the copending U.S. application Ser. No. 11,446, filed of even date herewith, and assigned to the assignee hereof.

In the Boyle-Smith disclosure referred to hereinabove a wide variety of means are disclosed for providing input stages and output stages for the monolithic devices disclosed therein. Inasmuch as all those means can as well be used in the apparatus described herein, they will not be described further.

It will be apparent to those in the art that a wide variety of methods can be used for fabricating the monolithic apparatus described hereinabove. While no particular methods will be described, it is believed a brief discussion of some material considerations is warranted. A very distinct advantage of the apparatus herein disclosed is that materials suitable for such devices are available and well understood. For example, the use of silicon for the semiconductive portions and silicon dioxide as the dielectric portions will be straightforward and in accordance with a well established technology. Combinations of dielectrics such as silicon oxide-silicon nitride, silicon oxide-aluminum oxide, etc. may be especially advantageous in certain circumstances as the dielectric layer. Known electrode materials such as gold, aluminum, platinum, molybdenum, titanium, and combinations thereof may of course be used.

For the purpose of illustration only, a useful structure for the devices shown in FIGS. 1, 2, 4, and 5 could employ 10 ohm-cm. N-type silicon as the semiconductive bulk portion. Silicon oxide thicknesses of 1,000 A.–2,000 A. for the thinner dielectric layer portions and 5,000 A.–10,000 A. for the thicker portions. Electrodes may be of gold or gold-platinum-titanium combinations in any typical thickness, e.g., 0.1 to several microns.

The dimensions of the transfer devices also can vary widely. Of course, the spacings of the electrodes (in order to provide the requisite depletion region overlap) will depend upon the lateral extent of the depletion regions under operating voltages. For example, in 10 ohm-cm. silicon, a voltage of 15 volts over a 1,000 A. silicon oxide will produce a depletion region of about 5 microns. This would suggest that an interelectrode spacing of no greater than several microns should be used. It should be apparent that the interelectrode spacings in the embodiment of FIGS. 4, 5, and 6 are much less critical than in FIGS. 1 and 2.

Of course, it should be understood that the devices described herein are in no way limited to silicon and its associated technology which has been described simply by way of example.

Various modifications and variations will no doubt occur to those skilled in the various arts to which this invention pertains. All such variations which basically rely on the teachings through which this disclosure has advanced the art are properly considered within the scope of this invention.

What is claimed is:

1. Information storage and transfer apparatus of the type adapted for storing and sequentially transferring mobile charge carriers coupled to locally induced potential energy minima within suitable storage media comprising:
- a storage medium;
- a dielectric layer disposed over the storage medium;
- two sets of electrodes disposed over the dielectric layer, each set including a plurality of electrodes, and the electrodes of the two sets being interleaved;
- a pair of conduction paths, each electrode of one set being electrically coupled to a common one of the pair of conduction paths, and each electrode of the other set being electrically coupled to the other of the pair of conduction paths; and
- the sets of electrodes being adapted and disposed relative to the storage medium such that upon application of sufficient operating voltages to the pair of conduction paths a plurality of asymmetrical potential wells are formed, separate ones of the potential wells being formed at least under each of the electrodes of one of the sets of electrodes, the asymmetry being such that relative to the desired direction of advance of stored mobile charge the leading portion of the potential well has a greater average depth than the trailing portion of the potential well.

2. The improvement of claim 1 wherein the electrodes are sufficiently closely spaced that adjacent potential wells overlap at some applied voltage less than that required to induce avalanche breakdown in the semiconductive wafer so that the stored charge can be transferred from one potential well to the one next adjacent in the desired direction.

3. The improvement of claim 1 wherein adjacent electrodes partially overlap without contacting each other, a portion of the dielectric lying between the electrodes at the points of overlap.

4. The improvement of claim 1 wherein each of the electrodes includes at least two physically and electrically connected parts,
- the one of said parts opposite the direction of advance overlying and being contiguous with a relatively thick dielectric portion and overlying the other part of the electrode previously adjacent,
- the other of said parts overlying and being contiguous with a relatively thin dielectric portion and underlying the one part of the electrode next adjacent.

5. The improvement of claim 1 in combination with
- input means for injecting minority carriers into at least one of said potential wells, said injected carriers representing signal information, and
- output means for detecting the presence of said minority carriers at some other potential well.

6. In information storage and transfer apparatus of the type including a storage medium over which there is disposed a dielectric layer and over which dielectric layer there is, in turn, disposed a plurality of sets of electrodes, each set including a plurality of electrodes, to which voltages can be applied sequentially for causing a succession of potential wells in which quantities of mobile charge can be stored in accordance with signal information and between which the stored charge can be transferred unidirectionally,
- the improvement for achieving unidirectional advance therethrough which comprises:
- a pair of conduction paths, every second electrode of said plurality of sets of electrodes being coupled to a common one of the pair of conduction paths and the remaining electrodes of said plurality of sets of electrodes being coupled to the other one of the pair of conduction paths; and
- means in response to sufficient voltages applied to the conduction paths for causing under each electrode the formation of an asymmetrical potential well, the asymmetry being such that relative to the desired direction of advance of stored mobile charge the leading portion of the potential well has a larger average depth than the trailing portion of the potential well.

7. Apparatus as recited in claim 6 wherein adjacent electrodes are sufficiently closely spaced that the depletion regions formed thereunder intersect each other at some applied voltage less than that required to induce avalanche breakdown in the semiconductive body.

8. Apparatus as recited in claim 6 additionally comprising means for injecting excess minority carriers into at least one of the depletion regions.

9. In semiconductor apparatus which includes a semiconductive wafer in which a succession of potential wells are established and provision is made for storing charge in selected ones in accordance with signal information and for advancing the stored charge through successive potential wells,
- the improvement for achieving unidirectional advance therethrough which comprises:
- means for providing asymmetry to the potential wells during the stored interval, the asymmetry being such that relative to the direction of advance the leading portion of the potential well has a larger average depth than the trailing portion of the potential well preliminary to advancing the stored charge, the means for providing asymmetry including a dielectric layer of varying thickness and a plurality of spaced, localized electrodes disposed over and contiguous with the dielectric layer successively in the desired direction of advance; and
- two-phase circuit means for successively biasing the electrodes sufficiently to cause the storage and advance of charge.

10. The improvement of claim 9 including a pair of conduction paths connected between the circuit means and the electrodes, each conduction path being connected to a different one of every second electrode in the succession of electrodes.

11. The improvement of claim 10 wherein the electrodes are shaped and disposed so that the pair of conduction paths extend parallel to one another.

12. Monolithic semiconductor apparatus adapted for the storage and sequential transfer of information in a predetermined direction from an input to an output comprising:
- a semiconductive body having a major surface;
- a dielectric layer of varying thickness overlying and contiguous with said surface;
- a plurality of localized, spaced conductive electrodes disposed successively over said layer between the input and the output;
- each of said electrodes overlying and being contiguous with a portion of the layer which is of substantially nonuniform thickness so that when a voltage of sufficient polarity and magnitude is applied to any of the electrodes with respect to the semiconductor, an asymmetrical potential well is formed in said semiconductor underneath the electrode, the asymmetry being such as to enhance the transfer of excess minority carriers in the potential well to an adjacent potential well in said predetermined direction and to impede the transfer of said carriers in the opposite direction;

means for injecting excess minority carriers into at least one of the potential wells; and means for sequentially biasing successive electrodes for sequentially inducing potential wells under the biased electrodes and for transferring the excess minority carriers successively with the potential wells.

13. Apparatus as recited in claim 12 wherein the means for biasing successive electrodes includes a pair of conduction paths, each connected to a different one of every second electrode in the succession of electrodes.

14. Apparatus as recited in claim 12 additionally comprising:

two-phase circuit means coupled to said pair of conduction paths for alternately applying a pair of voltages thereto with respect to the semiconductive body;

at least one voltage of the pair of voltages being of polarity and magnitude sufficient to produce a potential well in at least the portion of the body beneath the electrode to which it is coupled.

15. Apparatus as recited in claim 13 wherein the electrodes are shaped and disposed so that the pair of conduction paths extend parallel to one another.

16. Monolithic semiconductor apparatus adapted for the storage and sequential transfer of information in a predetermined direction from an input to an output comprising:

a semiconductive body having a major surface;

a dielectric layer of varying thickness overlying and contiguous with said surface;

a plurality of localized, spaced conductive electrodes disposed successively over said layer between the input and the output;

each of said electrodes overlying and being contiguous with a portion of the layer which is of substantially nonuniform thickness so that when a voltage of sufficient polarity and magnitude is applied to any of the electrodes with respect to the semiconductor, an asymmetrical potential well is formed in said semiconductor underneath the electrode, the asymmetry being such as to enhance the transfer of excess minority carriers in the potential well to an adjacent potential well in said predetermined direction and to impede the transfer of said carriers in the opposite direction; and wherein at least one of the electrodes includes at least three physically and electrically connected parts; the parts being considered first part, second part, and third part successively in said predetermined direction;

the first part overlying a thickest dielectric portion;

the second part overlying a thinnest dielectric portion; and the third part overlying a dielectric portion intermediate the thickness between said thickest and thinnest dielectric portions.

* * * * *

Notice of Adverse Decision in Interference

In Interference No. 98,199, involving Patent No. 3,651,349, D. Kahng and E. H. Nicollian, MONOLITHIC SEMICONDUCTOR APPARATUS ADAPTED FOR SEQUENTIAL CHARGE TRANSFER, final judgment adverse to the patentees was rendered Sept. 26, 1974, as to claims 5–8.

[*Official Gazette May 6, 1975.*]